United States Patent [19]

Takahara et al.

[11] Patent Number: 4,679,004
[45] Date of Patent: Jul. 7, 1987

[54] FREQUENCY SYNTHESIZER OF A PHASE-LOCKED TYPE WITH A SAMPLING CIRCUIT

[75] Inventors: Atsushi Takahara; Tomoyoshi Ishikawa; Hiroyuki Tanaka; Tamio Okui, all of Tokyo, Japan

[73] Assignee: NEC Corporation, Japan

[21] Appl. No.: 903,212

[22] Filed: Sep. 2, 1986

[30] Foreign Application Priority Data

Sep. 3, 1985 [JP] Japan .................................. 60-194093
Sep. 1, 1986 [JP] Japan .................................. 61-205464

[51] Int. Cl.⁴ .............................................. H03L 7/18
[52] U.S. Cl. ........................................ 331/14; 331/18; 331/25
[58] Field of Search .................... 331/1 A, 14, 16, 18, 331/25, 27; 455/260

[56] References Cited

U.S. PATENT DOCUMENTS

| 4,314,208 | 2/1982 | Munday | 331/25 X |
| 4,316,150 | 2/1982 | Crosby | 331/14 X |
| 4,392,113 | 7/1983 | Jackson | 331/14 |

Primary Examiner—Siegfried H. Grimm
Attorney, Agent, or Firm—Laff, Whitesel, Conte & Saret

[57] ABSTRACT

A frequency synthesizer comprises a voltage controlled generator (11) for generating an output signal of a desired frequency in response to a control signal and a reference signal generator (13) for generating a reference frequency signal. The output signal is sampled (21) by the reference frequency to produce a sampled signal. The reference frequency signal is frequency divided (22) by a division factor determined by the desired frequency and the reference frequency. The sampled signal and the divided signal are compared (15) in phase and frequency and the control signal is produced depending on the phase difference between the two signals. For the division factor, two different values are determined by the desired frequency and the reference signal and one of the two values is selected according to a selection pattern determined by the reference frequency and the desired frequency. A control circuit (41) calculates the two values and a multistage frequency divider (42) generates the selection pattern signal under control of the control circuit (41).

7 Claims, 6 Drawing Figures

FREQUENCY SYNTHESIZER OF A PHASE-LOCKED TYPE WITH A SAMPLING CIRCUIT

BACKGROUND OF THE INVENTION (1) Field of the Invention

The present invention relates to a frequency synthesizer having a phase-locked loop (PLL). The frequency synthesizer will be abbreviated to a PLL synthesizer hereinafter.

(2) Description of the Prior Art

As will later be described with reference to FIG. 1 of the accompanying drawings, a conventional PLL synthesizer comprises a voltage controlled oscillator (VCO). The oscillating frequency of the VCO is divided at a variable frequency divider and the resultant divided signal is compared in frequency and phase with a reference signal. The compared output is fed back to the VCO as a control voltage signal. The oscillating frequency of the VCO is controlled by the control voltage signal. When a division factor of the variable frequency divider is changed, the oscillating frequency of the VCO changes in steps of a frequency of the reference signal which is referred to as a step frequency. Thus, a desired frequency signal is obtained, as an output signal of the PLL synthesizer, from the VCO by adjusting the division factor of the variable frequency divider. In practice, a reference signal having the step frequency is obtained from a reference signal generator through a fixed frequency divider.

In the known PLL synthesizer, the phase noise characteristic of the VCO is degraded and it is difficult to determine the step frequency to be a reduced value, as will later be described.

SUMMARY OF THE INVENTION

It is an object of the present invention to provide a PLL synthesizer wherein the step frequency can be set to be a reduced value without any degradation of the phase noise characteristic of the VCO.

A PLL synthesizer of the present invention comprises oscillation generating means controlled by a control signal for generating, as the output oscillation signal, a controlled oscillation signal of a controlled frequency dependent on the control signal, and reference signal generating means for generating a reference signal having a constant reference frequency. The controlled oscillation signal is sampled by the reference signal at sampling means and a sampled signal is produced. The reference signal is frequency divided by a first division factor at frequency divider means and a first divided signal is produced. Control means adjusts the first division factor to be a value determined by the controlled frequency and the reference frequency. Detecting means detects a phase difference between the sampled signal and the first divided signal and produces a D.C. voltage signal depending on the phase difference. The D.C. voltage signal is negatively fed back, as the control signal, to the oscillation generating means.

DETAILED DESCRIPTION OF PREFERRED EMBODIMENTS

Prior to description of embodiments of the present invention, a known typical PLL synthesizer will be described with reference to FIG. 1, in favor of good understanding of the present invention.

Figure 1:
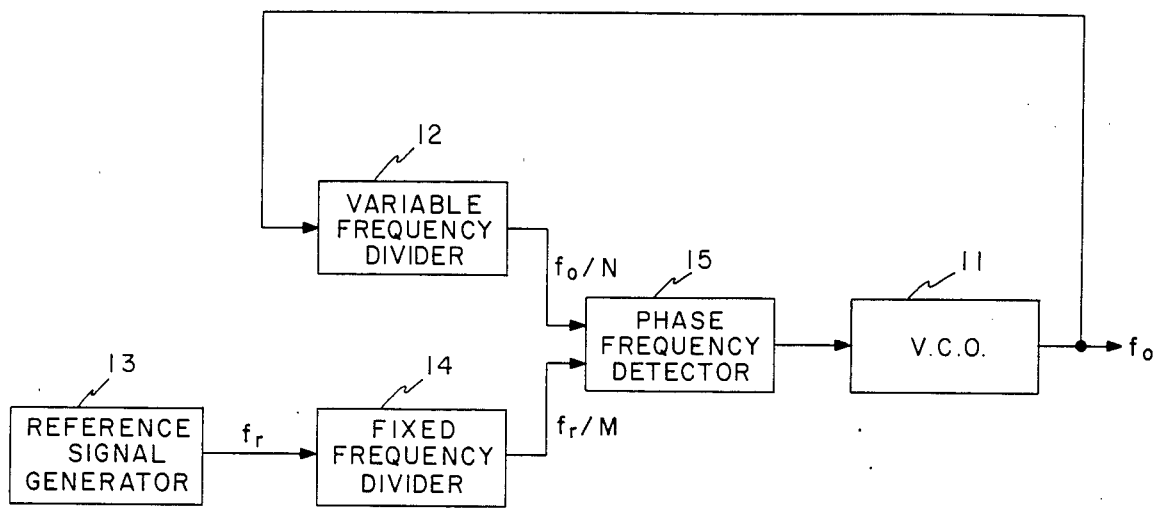
FIG. 1 is a block diagram of a conventional PLL synthesizer.

Referring to FIG. 1, the PLL synthesizer shown therein comprises a VCO 11 for generating an output signal of a frequency $f_0$ controlled by a control voltage signal. The output signal is applied to a variable frequency divider 12 where the frequency $f_0$ is divided by a division factor N adjusted or set therein to thereby produce a divided signal having a frequency $f_0/N$.

A reference signal generator 13 is, for example, a crystal oscillator, and generates a reference signal having a reference frequency $f_R$ which is constant. The reference signal is supplied to a fixed frequency divider 14 at which its frequency $f_R$ is divided by a fixed division factor M to thereby produce a comparing signal having a frequency $f_R/M$.

The divided signal and the comparing signal are supplied to a phase frequency detector 15, which produces a D.C. voltage signal depending on the phase difference between the divided signal and the comparing signal. The D.C. voltage is applied to the VCO 11 as the control voltage signal for controlling the frequency of the output signal of the VCO 11.

In the stable state, the oscillating frequency $f_0$ of the VCO 11 is represented by the following equation:

$$f_0 = (N/M)f_R \qquad (1)$$

Thus, if the division factor N is changed at the variable frequency divider 12, $f_0$ can be changed in steps of the frequency ($f_R/M$) of the comparing signal.

In the known PLL synthesizer, the frequency $f_R/M$ of the comparing signal is equivalently multiplied by N, as will be understood from equation (1). The frequency multiplication increases the phase modulation index, so that the phase noise characteristic of the VCO 11 is degraded, as described hereinbefore.

Furthermore, when the frequency $f_R/M$ of the comparing signal is too low, the oscillating frequency $f_0$ of the VCO 11 is disadvantageously frequency modulated by the low frequency component. When the phase locked loop is made to have a decreased loop bandwidth so as to avoid the frequency modulation, the phase noise of the VCO 11 cannot sufficiently be suppressed in the phase locked loop. Accordingly, the frequency $f_R/M$ of the comparing signal cannot sufficiently be reduced, so that it is difficult to change the oscillating frequency $f_0$ in steps of a reduced frequency, as described hereinbefore.

Figure 2:
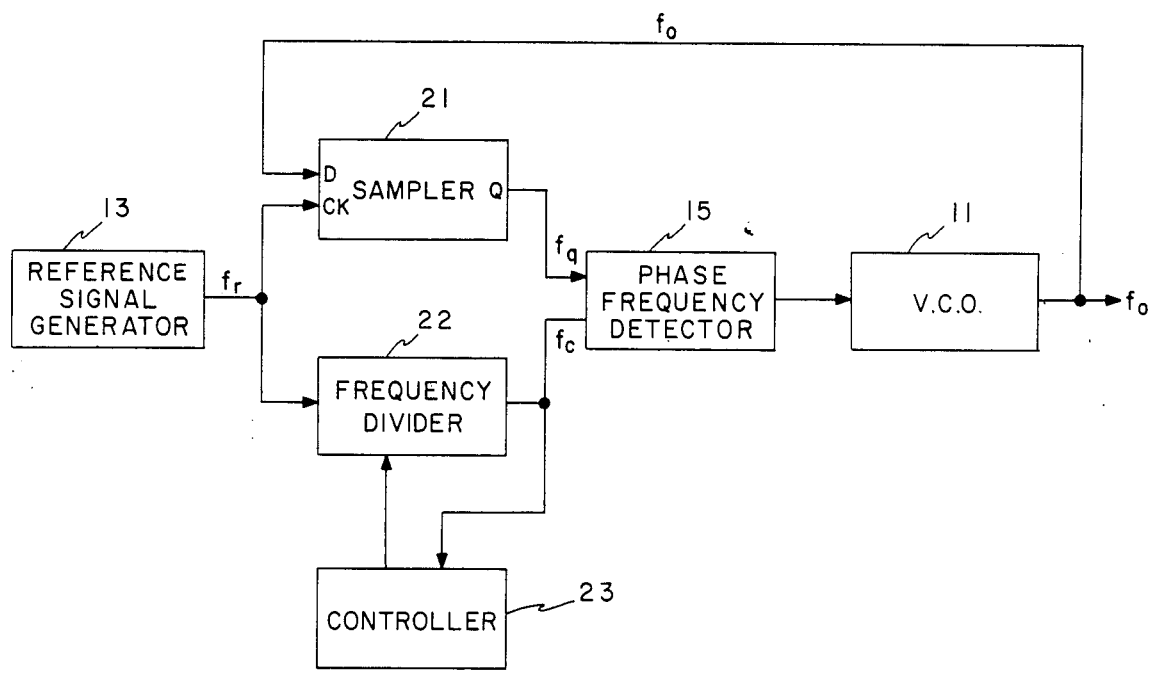
FIG. 2 is a block diagram of a PLL synthesizer according to an embodiment of the present invention.

Referring to FIG. 2, a PLL synthesizer according to an embodiment of the present invention comprises a VCO 11, a reference signal generator 13 and a phase frequency detector 15 similar to the known PLL synthesizer.

A sampler 21 and a frequency divider 22 are used in place of the variable and the fixed frequency dividers in the known PLL synthesizer, respectively.

The sampler 21 is for sampling the output signal of the frequency $f_0$ from the VCO 11 by the reference signal of the frequency $f_R$ from the reference signal generator 13 to produce a sampled signal.

The sampler 21 can be made by a D-type flipflop having a D input terminal D and a clock input terminal CK which receive the output signal from VCO 11 and the reference signal from reference signal generator 13, respectively. The sampled signal is obtained from an output terminal Q of the D-type flipflop.

A frequency $f_Q$ of the sampled signal is given by the following formulae:

$$f_Q = |f_0 - mf_R| \qquad (2)$$

$$f_Q \leq f_R/2 \qquad (3)$$

where $f_0 > f_R$ and m is a positive integer.

It is noted that a period of the sampled signal is integer times of a period ($1/f_R$) of the reference signal. However, $f_R/f_Q$ is not always integer but is integer only when the frequency $f_0$ is specific value. Accordingly, the period of the sampled signal is not constant but changes.

Providing that p represents a positive integer equal to, or larger than but adjacent to, a value of $f_R/|f_0 - mf_R|$, it will be understood that the sampler 2 produces a first signal having a period of $p/f_R$ and a second signal having another period $(p-1)/f_R$ repeatedly for a long time of A cycles under a condition of equations (2) and (3).

Providing that i represents the number of cycles where the signal having the period of $p/f_R$ is present during A cycles, (A−i) represents the number of cycles where the signal having the period of $(p-1)/f_R$ is present during A cycles. Accordingly, the period of A cycles is given by:

$$\frac{A}{f_Q} = \frac{i(p-1)}{f_R} + \frac{(A-i)p}{f_R}. \qquad (4)$$

Accordingly, the frequency of $f_Q$ is a mean value of two frequencies $f_R/p$ and $f_R/(p-1)$ and is given by:

$$f_Q = \frac{Af_R}{Ap - i}. \qquad (5)$$

Accordingly, when the frequencies $f_0$ and $f_R$ are given, a value of p is determined by the above-described definition of p, and values of A and i are also determined from formulae (2), (3), and (5).

With respect to a producing pattern of signals having the frequencies $f_R/p$ and $f_R/(p-1)$, one signal, which is present in the A cycles by a cycle number less than the other signal, is not successively present but present at intervals where the other signal is present. Accordingly, the producing pattern is determined by the values of A and i.

The frequency $f_R$ of the reference signal from reference signal generator 13 is divided at the frequency divider 22, which produces a comparing signal having a frequency $f_c$. The division factor of the frequency divider 22 is set to one of p and (p−1) by a controller 23 according to the producing pattern. Accordingly, the frequency $f_c$ of the comparing signal is equal to the frequency $f_Q$ of the sampled signal in the stable state of the phase locked loop.

The sampled signal and the comparing signal are supplied to the phase frequency detector 15 and are compared thereat. The phase frequency detector 15 produces a D.C. voltage signal depending upon the phase difference between both of the sampled and the comparing signals.

Any retiming means such as D-type flipflops can be used at the output sides of the sampler 21 and frequency divider 22 so as to make both of the sampled and the comparing signals in-phase with the reference signal.

The D.C. voltage signal is negatively fed back to the VCO 11 as the control votage signal, and therefore, the oscillating frequency $f_0$ of the VCO 11 is stabilized.

The oscillating frequency $f_0$ can be changed by changing the division factor and/or the producing pattern set in the frequency divider 22.

The oscillating frequency $f_0$ is determined, under a condition of $m = m_0$, by formulae (2), (3), and (5) as follows:

If $f_0 \leq (m_0 + \frac{1}{2})f_R$, $$f_0 = \{m_0 + A/(Ap - i)\}f_R \qquad (6)$$

While, if $f_0 \geq \{(m_0 + 1) - \frac{1}{2}\}f_R$, $$f_0 = \{(m_0 + 1) - A/(Ap - i)\}f_R \qquad (7).$$

In formulae (6) and (7), $$\frac{A}{Ap - i} = \frac{A}{p(A - i/p)}.$$

Since $(Ap - i) = f_R$ under a condition of the formula (5), the oscillating frequency $f_0$ can be increased or decreased by 1 when the value of A is increased or decreased by 1 while the value of i being increased or decreased by p.

At a start of the synthesizer, an initial oscillating frequency of the VCO is determined by designating a frequency band within which the VCO can oscillate or by feeding a predetermined voltage signal to the VCO together with the control voltage signal from the phase-frequency detector.

Several examples are demonstrated below.

EXAMPLE 1

Under a condition where $f_R = 200$ MHz, $f_0 = 648$ MHz, and $m = 3$, $p = 5$ is given by the definition of p because $f_R/|f_0 - mf_R| = 200/48 = 4.17$. From formula (5), $A = 48/4 = 6$ and $i = 40/8 = 5$.

Accordingly, if the division factor of the frequency divider 22 is set by the controller 23 according to the values of p, A, and i, the oscillating frequency $f_0$ of the VCO 11 is stabilized at 648 MHz.

In this connection, A and i are given by the minimum values for satisfying formula (5), but they can be given by multiples of the minimum values, for example, $A = 48$ and $i = 40$.

EXAMPLE 2

When $f_0$ is desired to be 649 MHz which is higher by 1 MHz than 648 MHz in Example 1, p is maintained 5.

While, $A = f_Q = 649 - 600 = 49$ and $i = 45$ from formula (5).

The division factor of the frequency divider 22 is set to be p and (p−1) switchingly according to the producing pattern determined by the values of A and i by controller 23, the oscillating frequency $f_0$ is changed to 649 MHz and is stabilized thereat.

EXAMPLE 3

When $f_0$ is desired to be 650 MHz which is further higher by 1 MHz than Example 2, p=4 because $f_R/|f_0 - mf_R| = 200/50 = 4$. It is always under a condition of $f_R = 4f_Q$. Accordingly, no signal having a frequency of $f_R/(p-1)$ is present. Therefore, i=0 and A can be set arbitrary value, for example, A=50. Accordingly, when the division factor of the frequency divider 22 is set a fixed value p=4, the oscillating frequency $f_0$ of the VCO 11 is maintained at 650 MHz.

In order to set $f_0 = 651$ MHz, A is increased by 1 to make A=51, and i is increased by 4 (=p).

Now, description is made as to the controller 23 for setting into the frequency divider 22 a division factor p or (p−1) selectively according to the producing pattern determined by A and i.

Figure 3:
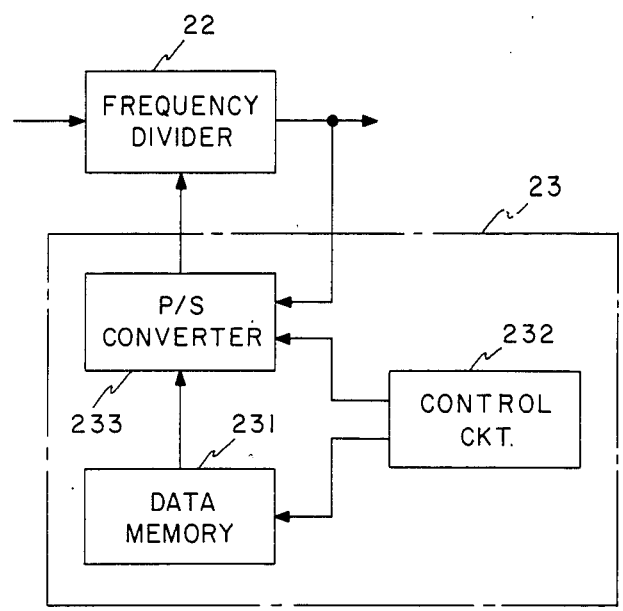
FIG. 3 is a block diagram illustrating a controller together with a frequency divider used in the embodiment of FIG. 2.

Referring to FIG. 3, an embodiment of the controller 23 comprises a data memory 231. The data memory 231 stores a series of division factor data comprising values of p and (p−1) arranged according to the producing pattern. A control circuit 232 reads the series of division factor data to a parallel-series (P/S) converter 233. The P/S converter 233 converts the read parallel data into serial data and applies the values of the division factor data into frequency divider 22 one after another in synchronization with the output signal from the frequency divider 22.

In Example 1, the producing pattern of the division factors p=5 and (p−1)=4 is a numerical sequence represented by the following formula:

$$\ldots 5\ 4\ 4\ 4\ 4\ 5\ 4\ 4\ 4\ 4\ 5\ 4 \ldots \quad (8).$$

The data memory 231 stores a series of 6-bit data of 1, 0, 0, 0, 0, 0. The 6-bit data are supplied to the frequency divider 22 one bit after another. The frequency divider 22 makes the division factor of 5 when receiving "1", while making the division factor of 4 in response to reception of "0". Thus, the division factor of the frequency divider 22 can be set to a desired value determined by the reference frequency $f_R$ and the desired oscillating frequency $f_0$ of the VCO 11.

In Example 2, the producing pattern of the division factors p=5 and (p−1)=4 is given by a numerical sequence represented by the following formula:

$$\ldots 5\ 4\ 4\ 4\ 4\ 4\ 4\ 4\ 4\ 4\ 4\ 4\ 5\ 4\ 4\ 4\ 4 \\ 4\ 4\ 4\ 4\ 4\ 4\ 4\ 5\ 4\ 4\ 4\ 4\ 4\ 4\ 4\ 4\ 5 \\ 4\ 4\ 4\ 4\ 4\ 4\ 4\ 4\ 4\ 5\ 4\ 4\ 4\ 4 \ldots \quad (9).$$

The data memory 231 is required to store a series of data having 49 (=A) bits.

Similarly, when $f_R = 200$ MHz and $f_0 = 649.9$ MHz, the data of 499 bits are required. For $f_0 = 649.99$ MHz, 4999-bit data are required.

This means that a large memory capacity is required for the data memory 231.

Figure 4:
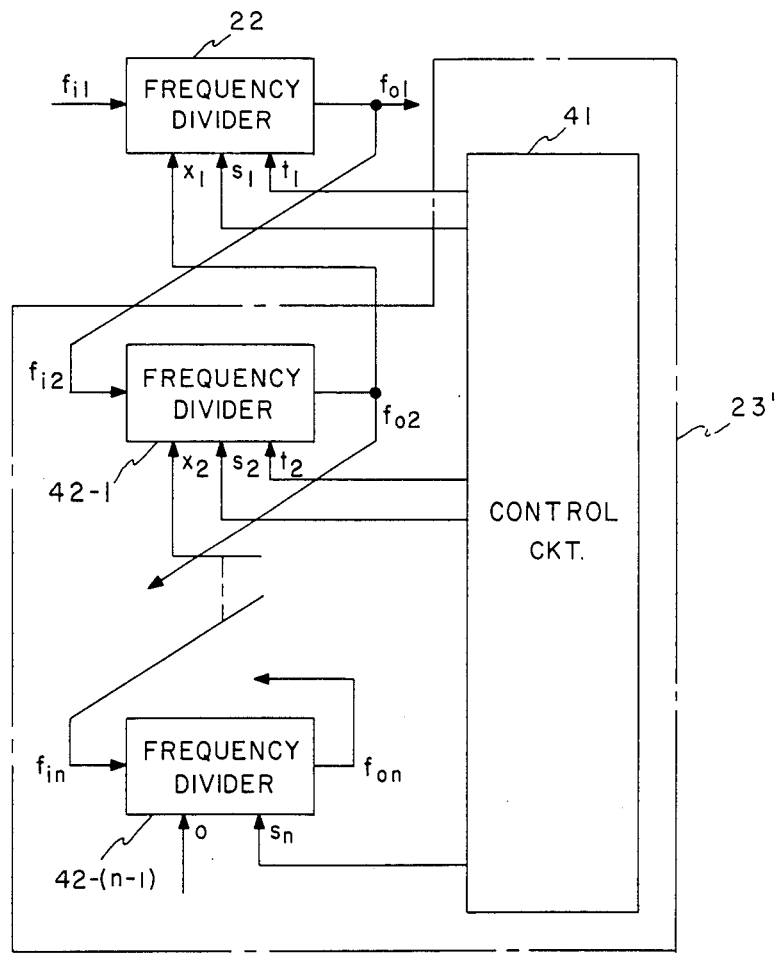
FIG. 4 is a block diagram illustrating another controller together with a frequency divider used in the embodiment of FIG. 2.

FIG. 4 shows another embodiment of the controller.

Now, description is made as to a principle of the controller of FIG. 4.

It is provided that S represents one of two division factors p and (p−1) which is present in the series of division factor data more times than the other. In Example 2, S=4 as is noted from formula (9). Considering a period when the other division factor, or 5 in Example 2, is present in the series of division factor data, the period changes according to a pattern represented by the following formula:

$$\ldots 13\ 12\ 12\ 12\ 13\ 12\ 12\ 12 \ldots \quad (10).$$

It is provided that $A_1$ represents the numerical sequence represented by formula (9) while $A_2$ represents the numerical sequence represented by formula (10).

In formula (10), when $S_2 = 12$, the period when 13 ($\neq S_2$) is present in the numerical sequence, $A_2$ is given by 4. $A_3$ is used to represent the period 4. That is:

$$A_3 : 4 \quad (11).$$

Now, $A_n$ (n=1, 2, 3, ...) is used to generally represent a numerical sequence such as $A_1$, $A_2$, and $A_3$, obtained in the similar manner. When $N_n$ represents a number of elements in the numerical sequence, and when $S_n$ represents an element which is present more times than the other in the numerical sequence, $t_n$ is given by:

$$t_n = (\text{element which is not the element } S_n) - S_n \quad (12).$$

The values of n, $N_n$, $S_n$ and $t_n$ for Example 2 are given in Table 1.

TABLE 1

| n | $N_n$ | $S_n$ | $t_n$ |
|---|-------|-------|-------|
| 1 | 49    | 4     | 1     |
| 2 | 4     | 12    | 1     |
| 3 | 1     | 4     | (0)   |

When $f_0$ and $f_R$ are given, a series of division factor data is obtained in a similar manner. When a numerical sequence $A_1$ represents the series of division factor data, another numerical sequence $A_2$ is obtained from the numerical sequence in the similar manner. The last numerical sequence $A_n$ obtained by the similar manner comprises only one element $S_n$. Then, $t_n = 0$.

The relationship between $N_n$, $S_n$ and $t_n$ is given by the following formulae:

$$N_{k-1} = N_k S_k + N_{k+1} t_k \quad (1 \leq k \leq n) \quad (13),$$

$$N_k/2 \geq N_{k+1} \quad (14),$$

$$N_0 = af_R, \quad N_1 = af_Q \quad (15),$$

where $f_Q = |f_0 - mf_R|$, a is a real number, $N_k$ and $S_k$ are natural numbers, and $t_k$ is one of −1, 0, and 1.

$S_1$ to $S_n$ and $t_1$ to $t_n$ can be calculated from given frequencies of $f_0$ and $f_R$ using formulae (13), (14), and (15). From the calculated $S_1$ to $S_n$ and $t_1$ to $t_n$, the numerical sequence $A_1$, that is, a series of division factor data can be obtained by calculation. Since the calculation is complex, it is difficult to design an arithmetic circuit for calculating the series of division factor data.

The controller 23' of FIG. 4 can provide the series of division factor data to the frequency divider 22 without performing such a complex calculation.

Referring to FIG. 4, the controller 23' comprises a control circuit 41 which calculates $S_1$ to $S_n$ and $t_1$ to $t_n$ from given frequencies $f_0$ and $f_R$ using the formulae (13), (14), and (15). The controller 23' further comprises a plurality of $(n-1)$ frequency dividers 42—1 to 42—$(n-1)$.

Each frequency divider of 42—1 to 42—$(n-1)$ has a similar arrangement as the frequency divider 22.

Figure 5:
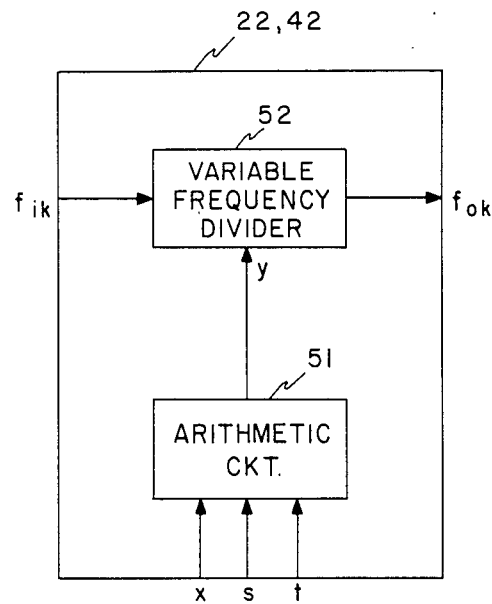
FIG. 5 is a block diagram of each frequency divider used in FIG. 4.

Referring to FIG. 5, each frequency divider of 22 and 42 comprises two data input terminals S and t, a selection terminal x, an arithmetic circuit 51, and a variable frequency divider 52.

The arithmetic circuit 51 receives data $S_k$ and $t_k$ through data input terminals x and t and a selection signal $x_k$ through selection terminal and executes the calculation represented by the following equations:

When $x_k=0$, $y_k=S_k$ (16), and when $x_k=1$, $y_k=S_k+t_k$ (17).

The variable frequency divider 52 divides an input frequency $f_{ik}$ by a division factor $y_k$ to produce an output signal of a frequency $f_{0k}$ $(=f_i/y_k)$. Accordingly, the variable frequency divider 52 produces "0" signal during $(y_k-1)$ cycles in a time period of $y_k$ cycles and "1" signal during the remaining one cycle. When the output signal of the frequency divider 52 is changed from "1" signal to "0" signal, the frequency divider 52 reads the division factor $y_k$ from the arithmetic circuit.

Turning to FIG. 4, frequency dividers 42—1 to 42—$(n-1)$ are connected in a multistage form such that one stage frequency divider receives an output frequency from the next preceding stage frequency divider. While, the output signal from one stage frequency divider is also supplied to the selection terminal of the next preceding stage frequency divider. The first frequency divider 42—1 receives the output signal having a frequency $f_{01}$ from the frequency divider 22 and divides the frequency $f_{01}$. An output signal having a frequency $f_{02}$ of frequency divider 42—1 is supplied to the next succeeding stage frequency divider and also applied to the selection terminal $x_1$ of the frequency divider 22 as the selection signal.

The control circuit 41 supplies the calculated $S_1$ to $S_n$ and $t_1$ to $t_n$ to data input terminals S and t of the frequency dividers 22 and 42—1 to 42—$(n-1)$.

Figure 6:
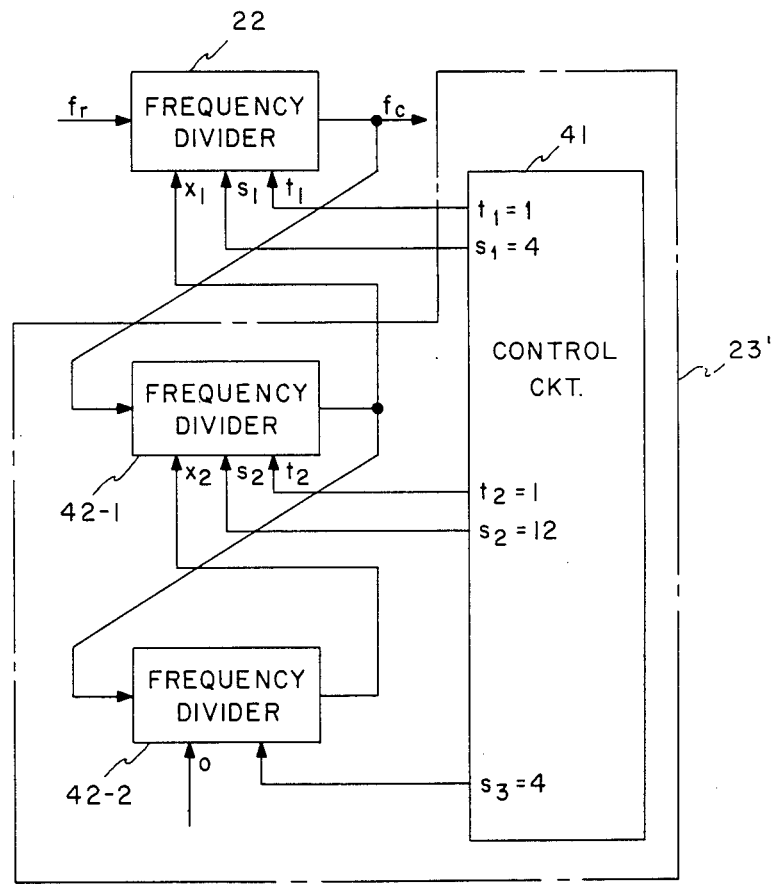
FIG. 6 is a block diagram of an example of the circuit in FIG. 4.

The operation of the controller 23' will be described in connection with Example 2, with reference to FIG. 6.

In Example 2, $n=3$ as shown in Table 1. Accordingly, two frequency dividers 42—1 and 42—2 are used. $S_1$ to $S_3$ and $t_1$ to $t_3$ have values shown in Table 1 and are calculated in control circuit 41. $S_1$ and $t_1$ are applied to the data input terminals of frequency divider 22. An output signal of the first stage frequency divider 42—1 of the controller 23' is applied to the selection terminal $x_1$ of frequency divider 22. When $x_1=0$, the division factor of frequency divider 22 is $S_1=4$ from equation (16). Alternatively, when $x_1=1$, the division factor is $S_1+t_1=4+1=5$ from equation (17). The value of $x_1$ is determined by the output signal from the first stage frequency divider 42—1.

The values 12 and 1 of $S_2$ and $t_2$ in Table 1 are set in frequency divider 42—1 by the control circuit 41. The selection signal $x_2$ is provided by an output of the second stage frequency divider 42—2. When $x_2=0$, the division factor of frequency divider 42—1 is $S_2=12$ from equation (16). While it is $S_2+t_2=13$ for $x_2=1$.

Accordingly, the output frequency $f_c$ is divided by 13 or 12 at first stage frequency divider 42—1 in dependence on $x_2=1$ or 0. Therefore, first stage frequency divider 42—1 produces "1" signal once per 13 cycles of 12 cycles while "0" signal being maintained for the remaining 12 cycles or 11 cycles. As a result, the division factor of frequency divider 22 is 5 once per 13 cycles or 12 cycles and is maintained 4 for the remaining 12 cycles or 11 cycles.

The values 4 and 0 of $S_3$ and $t_3$ in Table 1 are set to the second frequency divider 42—2 by control circuit 41. The data input terminal $t_3$ is omitted because $t_3=0$. Further, $y_3$ is always 4 from equations (16) and (17), so that the selection signal $x_3$ is maintained "0". Accordingly, the division factor of second stage frequency divider 42—2 is maintained 4, and the output frequency $f_{02}$ from first stage frequency divider 42—1 is divided by 4. Therefore, the second stage frequency divider 42—2 produces "1" signal once per 4 cycles of the frequency $f_{02}$ and produces "0" signal during the remaining 3 cycles.

As a result, the division factor of first stage frequency divider 42—1 is 12 once per 4 cycles of the frequency $f_{02}$ and is 13 for the remaining 3 cycles. That is, the series of division factor data in first stage frequency divider 42—1 is represented by the numerical sequence of formula (10).

As a result, the division factor of frequency divider 22 is changed so that a first pattern is present where the division factor is 5 once per 13 cycles of the frequency $f_c$ and 4 during the remaining 12 cycles, and thereafter a second pattern is repeated 4 times where the division factor is 5 once per 12 cycles and 4 during the remaining 11 cycles.

Thus, the series of division factor data in the frequency divider 22 is equal to the numerical sequence represented by formula (9). That is, the division factor of frequency divider 22 is set according to the series of division factor data determined by the given frequencies of $f_0$ and $f_R$.

In Example 1, $N_n$, $S_n$, and $t_n$ are given in Table 2.

TABLE 2

| n | $N_n$ | $S_n$ | $t_n$ |
|---|---|---|---|
| 1 | 48 | 4 | 1 |
| 2 | 1 | 6 | 0 |

The controller 23' can be arranged by the use of a single stage of frequency divider. However, the controller 23' may have two or more stage frequency dividers 42—1 and 42—2 as shown in FIG. 6. In the case, $S_3$ of the second stage frequency divider 42—2 can be set a voluntary number, because the division factor of the frequency divider 42—1 is constant and $S_2=6$ in no relation to the value of $x_2$ because $t_2=0$.

Now, it is considered to give a value of 5 $(=6-1)$ to $S_2$. Then, the values of $N_n$, $S_n$, and $t_n$ are given in Table 3.

TABLE 3

| n | $N_n$ | $S_n$ | $t_n$ |
|---|---|---|---|
| 1 | 48 | 4 | 1 |
| 2 | 1 | 5 | 1 |
| 3 | 1 | 1 | 0 |

In the case, the second frequency divider 42—2 always produces "1" signal. Accordingly, the division factor of the first frequency divider 42—1 is always 6. This is equivalent to the case where the values in Table 2 are directly set to frequency dividers 22 and 42—1.

According to the present invention, the frequency of the comparing signal is not lower than $f_R/p$, and therefore, it can be maintained comparatively high. Therefore, the loop band-width of the phase locked loop can be determined comparatively large, so that the phase noise in the VCO output signal can be sufficiently suppressed. Further, since the VCO output signal is not frequency divided but is frequency converted to a signal of a reduced frequency by sampling, the phase noise characteristic of the VCO output is not degraded. Therefore, the step frequency can be reduced without degradation of the phase noise characteristic.

What is claimed is:

1. A frequency synthesizer of a phase-locked loop type for synthesizing an output oscillation signal having a desired frequency from a reference signal having a constant reference frequency, said frequency synthesizer comprising:

oscillation generating means controlled by a control signal for generating, as said output oscillation signal, a controlled oscillation signal of a frequency dependent on said control signal;

preference signal generating means for generating said reference signal;

sampling means for sampling said controlled oscillation signal by said reference signal to produce a sampled signal;

frequency divider means for frequency dividing said reference signal by a first division factor to produce a first divided signal;

control means for controlling said frequency divider means to adjust said first division factor to a value determined by said desired frequency and said reference frequency; and detecting means for detecting a phase difference between said sampled signal and said first divided signal to produce a D.C. voltage signal dependent on said difference, said D.C. voltage signal being negatively fed back, as said control signal, to said oscillation generating means.

2. A frequency synthesizer as claimed in claim 1, wherein said control means comprises store means storing a numerical sequence, said numerical sequence comprising two different values arranged in accordance with a selecting pattern for selecting one of said different values, said two different values and said selecting pattern being determined by said desired frequency and said reference frequency, reading means for reading said numerical sequence from said store means, and impressing means for impressing said numerical sequence on said frequency dividing means whereby said first division factor is selectively adjusted to one of said two values.

3. A frequency synthesizer as claimed in claim 1, wherein said frequency dividing means comprises first data input terminal means for receiving first division factor data, first selection input terminal means for receiving a first selection signal, first arithmetic circuit means for executing one of two kinds of calculation of said first division factor data selected by said first selection signal to produce the value for said first division factor and a first variable frequency divider means for frequency dividing said reference signal by said first division factor, said control means supplying said dividing factor data and said selection signal.

4. A frequency synthesizer as claimed in claim 3, wherein said control means comprises a control circuit for determining said first division factor data from said desired frequency and said reference frequency, and a plurality of (n−1) frequency dividers connected in cascade to form a multistage frequency divider means such that one stage frequency divider divides an output signal from another frequency divider at a next preceding stage, a first stage frequency divider of said multistage frequency divider for dividing said comparing signal from said frequency dividing means to produce, as said first selection signal, a divided output signal.

5. A frequency synthesizer as claimed in claim 4, wherein each of said (n−1) frequency dividers comprises second data input terminal means for receiving second division factor data, second selection input terminal means for receiving a second selection signal, second arithmetic circuit means for executing one of two kinds of calculation of said second division factor data selected by said second selection signal to produce a second division factor, and a second variable frequency divider for frequency dividing an output signal from the next preceding frequency divider by said second division factor, said control circuit supplying the second division factor data.

6. A frequency synthesizer as claimed in claim 5, wherein said frequency dividing means and said (n−1) frequency dividers form an n-stage frequency divider such that said frequency divider is at a first stage and said (n−1) frequency dividers are at the following second to n-th stages, respectively, said control circuit executing calculation of the following formulae (1) to (5) to provide values of parameters of $S_n$ and $t_n$ (n=0, 1, 2, ...):

$$N_{k-1} = N_k S_k + N_{k+1} t_k \quad (1)$$

$$N_{k/2} \geq N_{k+1} \quad (2)$$

$$N_0 = a \cdot f_R \quad (3)$$

$$N_1 = a \cdot f_Q \quad (4)$$

$$f_Q = |f_0 - m f_R| \quad (5)$$

where $f_0$ is said desired frequency, $f_R$ being said reference frequency, k=0, 1, 2, 3, ..., n, $N_k$ and $S_k$ being natural numbers, m being a positive integer, a being a real number, and $t_k = 1, 0,$ or $-1$, the values of $S_k$ and $t_k$ being applied to the k-th stage frequency divider in such a manner that a pair of values of $S_1$ and $t_1$ are applied to said first data input terminal means of said frequency dividing means at said first stage, and another pair of values of $S_n$ and $t_n$ are applied to the second data input terminal means of said frequency divider at said n-th stage.

7. A frequency synthesizer as claimed in claim 6, wherein said arithmetic circuit of said k-stage frequency divider performs first calculation of $y_k = S_k$ when the selection signal is a "0" signal and performs second calculation of $y_k = S_k + t_k$ when the selection signal is a "1" signal, the value of $y_k$ being set to the variable counter of said k-th frequency divider as its division factor.

* * * * *

UNITED STATES PATENT AND TRADEMARK OFFICE
CERTIFICATE OF CORRECTION

PATENT NO. : 4,679,004

DATED : July 7, 1987

INVENTOR(S) : Atsushi Takahara; Tomoyoshi Ishikawa; et al

It is certified that error appears in the above-identified patent and that said Letters Patent is hereby corrected as shown below:

Col. 4, line 16, change "votage" to --voltage--;

Col. 9, line 28, "preference" should be --reference--.

Signed and Sealed this

Twenty-ninth Day of March, 1988

Attest:

DONALD J. QUIGG

Attesting Officer

Commissioner of Patents and Trademarks